United States Patent [19]

Sohn et al.

[11] Patent Number: 5,751,176
[45] Date of Patent: May 12, 1998

[54] CLOCK GENERATOR FOR GENERATING COMPLEMENTARY CLOCK SIGNALS WITH MINIMAL TIME DIFFERENCES

[75] Inventors: Jang Sub Sohn; Yong-Weon Jeon, both of Seoul, Rep. of Korea

[73] Assignee: LG Semicon Co., Ltd., Choongchungbook-Do, Rep. of Korea

[21] Appl. No.: 579,476

[22] Filed: Jan. 4, 1996

[51] Int. Cl.[6] .................................................. H03K 3/00
[52] U.S. Cl. ............................ 327/295; 327/257; 327/259
[58] Field of Search .............................. 327/57, 291, 295, 327/256, 257, 258, 259, 165, 375, 437, 333, 297; 326/82, 83, 86

[56] References Cited

U.S. PATENT DOCUMENTS

| 5,187,686 | 2/1993 | Tran et al. | 327/170 |
|---|---|---|---|
| 5,198,699 | 3/1993 | Hashimoto et al. | 327/437 |
| 5,231,319 | 7/1993 | Crafts et al. | 327/277 |
| 5,281,865 | 1/1994 | Yamashita et al. | 327/208 |
| 5,373,199 | 12/1994 | Shichinohe et al. | 326/83 |
| 5,508,648 | 4/1996 | Banik | 327/212 |

FOREIGN PATENT DOCUMENTS

| 5-206805 | 8/1993 | Japan | 327/264 |
|---|---|---|---|

*Primary Examiner*—Kenneth B. Wells
*Attorney, Agent, or Firm*—Fleshner & Kim

[57] ABSTRACT

An improved complementary-type clock generator minimizes the time difference between a normal clock signal and an inverted clock signal. The clock generator includes an inverting unit for outputting Vcc–Vtn and Vss+Vtp level voltage by pulling up and pulling down the source voltage and ground voltage in accordance with an externally applied clock signal, and a first buffer for outputting Vcc–Vtn and Vss+Vtp level voltages by pulling up and pulling down the source voltage and ground voltage in accordance with an externally applied clock signal. A level converting unit receives the Vcc–Vtn and Vss+Vtp level voltages and second and third buffers inverters the outputs of the level converting unit for outputting a normal clock signal and an inverted clock signal.

18 Claims, 1 Drawing Sheet

CLOCK GENERATOR FOR GENERATING COMPLEMENTARY CLOCK SIGNALS WITH MINIMAL TIME DIFFERENCES

BACKGROUND OF THE INVENTION

1. Field of the Invention

The present invention relates to a complementary-type clock generator, and in particular to an improved complementary-type clock generator which generated a normal clock signal and an inverted clock signal with minimal time differenced.

2. Description of the Conventional Art

FIG. 1 shows a conventional complementary-type clock generator, which includes an inverting unit 1 for inverting an external clock signal CLKin, a buffer 2 for inverting the external clock signal CLKin, and inverters I2 and I5 for inverting the output of the inverting unit 1 and the buffer 2 and for outputting a normal clock signal CLKout and an inverted clock signal CLKoutB.

The operation of the conventional complementary-type clock generator will now be explained with reference to FIG. 1.

To begin with, when an externally applied clock signal CLKin is inputted to the inverting unit 1 and the buffer 2, respectively, the inverter I1 inverts the clock signal CLKin and outputs an inverted clock signal, and the inverters I3 and I4 sequentially invert the inputted clock signal CLKin and outputs a normal clock signal.

Thereafter, the inverter I2 re-inverts inverted clock signal outputted from the inverting unit 1 and outputs a normal clock signal CLKout, and the inverter I5 re-inverts again the normal clock signal outputted from the buffer 2 and outputs an inverted clock signal CLKoutB.

However, since the conventional complementary-type has an asymmetrical construction between the inverting unit having an odd number of inverters and the buffer having an even number of inverters, there exists a prescribed time difference between a normal clock signal and an inverted clock signal.

Therefore, in order to compensate the time difference therebetween, it is necessary to accurately adjust the driving capacitance of each element. In addition, the adjusted capacitance may easily be varied due to various factors such as fabrication error, temperature, voltage or the like.

SUMMARY OF THE INVENTION

Accordingly, it is an object of the present invention to provide a complementary-type clock generator, which overcomes the problems encountered in a conventional complementary-type clock generator.

It is another object of the present invention to provide an improved complementary-type clock generator having a symmetrical construction which minimizes the time difference of a normal clock signal and an inverter clock signal.

To achieve the above objects, in accordance with a first embodiment of the present invention, there is provided a complementary-type clock generator, which includes an inverting unit for outputting Vcc−Vtn and Vss+Vtp level voltages by pulling up and pulling down the source voltage Vcc and ground voltage Vss in accordance with an externally applied clock signal; a first buffer for outputting Vcc−Vtn and Vss+Vtp level voltages by pulling up and pulling down the source voltage and ground voltage in accordance with an externally applied clock signal; a level converting unit for receiving Vcc−Vtn and Vss+Vtp level voltages outputted from the inverting unit and the first buffer and for recovering into CMOS level signal; and second and third buffers for inverting the output of the level converting unit and for outputting a normal clock signal and an inverting clock signal.

To achieve the above objects, in accordance with a second embodiment of the present invention, there is provided a complementary-type clock generator, which includes an inverting unit for outputting Vcc−Vtn and Vss+Vtp level voltage by pulling up and pulling down the source voltage and ground voltage in accordance with an externally applied clock signal; a first buffer for outputting Vcc−Vtn and Vss+Vtp level voltages by pulling up and pulling down the source voltage and ground voltage in accordance with an externally applied clock signal; and second and third buffers for receiving Vcc−Vtn and Vss+Vtp level voltages outputted from the inverting unit and the first buffer and for outputting a normal clock signal and an inverting clock signal.

DETAILED DESCRIPTION OF THE INVENTION

Figure 1:
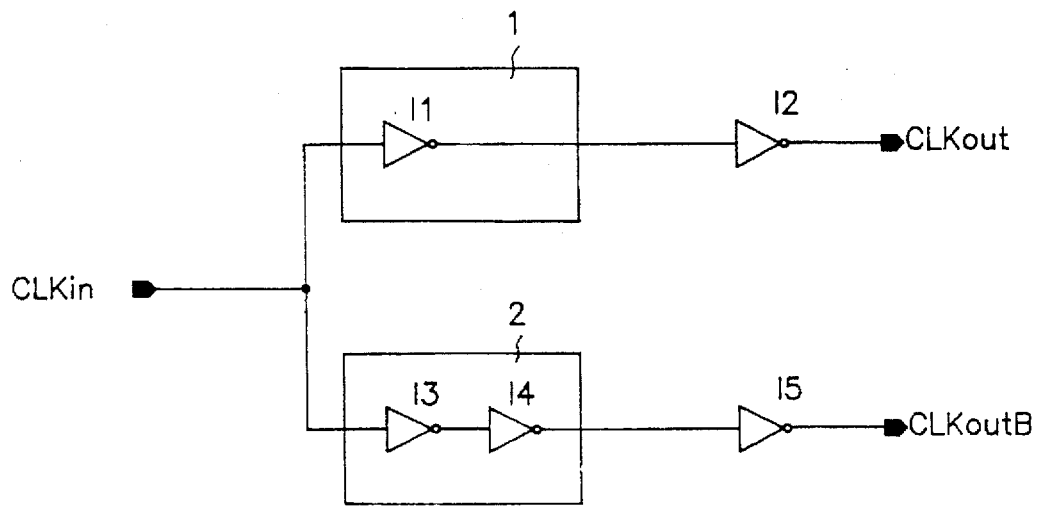
FIG. 1 is a circuit diagram of a conventional complementary-type clock generator.
Figure 2:
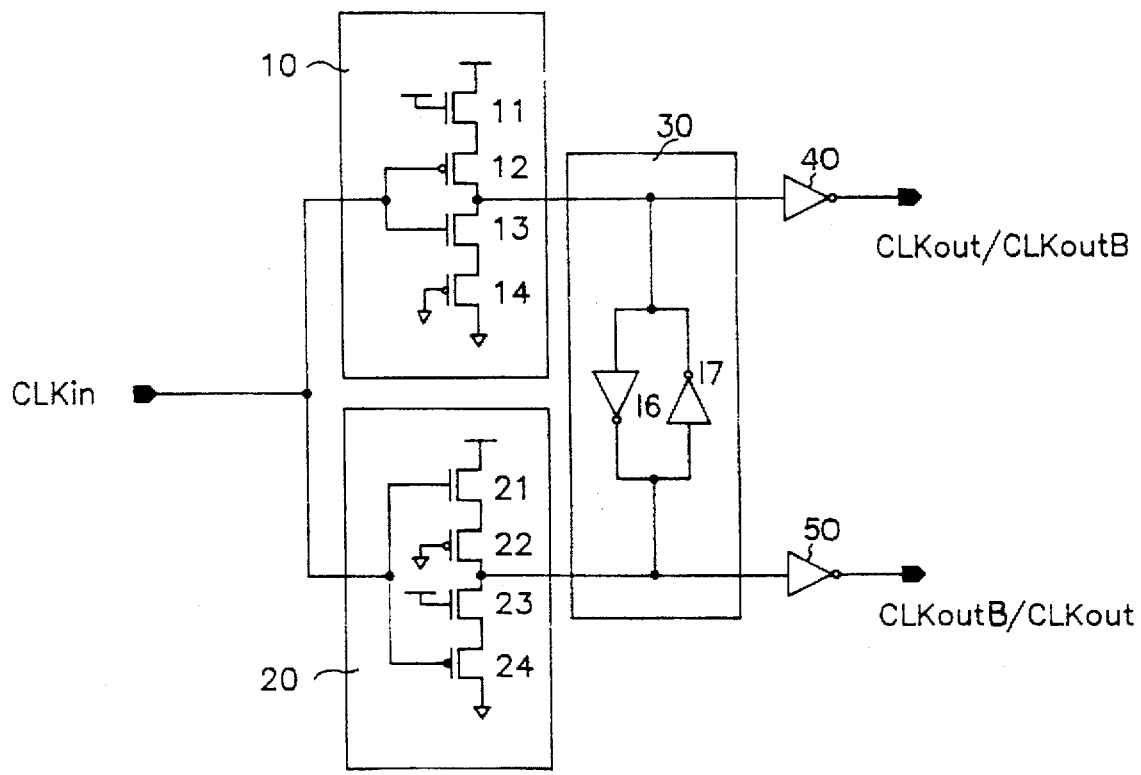
FIG. 2 is a circuit diagram of a complementary-type clock generator according to the present invention.

FIG. 2 shows a complementary-type clock generator, which includes an inverter is for outputting a voltage having levels of Vcc−Vtn and Vss+Vtp by pulling up and pulling down a voltage Vcc and a ground voltage Vss in accordance with an external clock signal CLKin, a buffer 20 for outputting voltage having levels of Vcc−Vtn and Vss+Vtp by pulling up and pulling down a voltage Vcc and a ground voltage Vss in accordance with an external clock signal CLKin, a level converting unit 30 for receiving voltage having levels of Vcc−Vtn and Vss+Vtp outputted from the inverting unit 10 and the buffer 20 and for converting the signal to a CMOS level, and buffers 40 and 50 for inverting the output of the level converting unit 30 and for outputting a normal clock signal CLKout and an inverted clock signal CLKoutB.

In the inverting unit 10, the voltage Vcc terminal is connected to the ground voltage Vss terminal in series through a pull-up NMOS transistor 11, a PMOS transistor 12, an NMOS transistor 13, and a pull-down PMOS transistor 14. The gates of the PMOS transistor 12 and the NMOS transistor 13 are commonly connected to a clock input terminal CLKin, and the commonly connected drains of the transistors 12 and 13 form an output terminal.

In the buffer 20, the voltage Vcc terminal is connected to the ground voltage Vss terminal in series through an NMOS transistor 21, a pull-up PMOS transistor 22, a pull-down NMOS transistor 23, and a PMOS transistor 24. The gates of the NMOS transistor 21 and the PMOS transistor 24 are commonly connected to a clock input terminal CLKin, and the commonly connected drain terminals of the pull-up PMOS transistor 22 and the pulldown NMOS transistor 23 form of an output terminal.

In addition, in the level converting unit 30, the input terminal of the inverter I6 and the output terminal of the inverter I7 are commonly connected to the output terminal of the inverting unit 10, and the output terminal of the inverter I6 and the input terminal of the inverter I7 are commonly connected to the output terminal of the buffer 20.

The operation of the complementary-type clock generator according to the present invention will now be explained with reference to FIG. 2.

To begin with, when a high level clock signal CLKin is inputted to the inverting unit 10 and the buffer 20, respectively, the NMOS transistor 13 of the inverting unit 10 and the NMOS transistor 21 of the buffer 20 are turned on.

At this time, the pull-up NMOS transistor 11, the pull-down PMOS transistor 14, the pull-up PMOS transistor 22, and the pull-down NMOS transistor 23 are always turned on in accordance with the voltage Vcc and the ground voltage Vss applied thereto through the gates thereof.

Therefore, the drain of the pull-down PMOS transistor 14 receives the voltage Vss+Vtp. Since the drain of the pull-up PMOS transistor 14 is the same as the source of transistor 13, the source voltage Vss+Vtp of the pull-down PMOS transistor 14 is outputted to the output terminal of the inverter 10, and the drain voltage Vcc−Vtn of the NMOS transistor 21 is outputted to the output terminal of the buffer 20.

Thereafter, the level converting unit 30 receives the voltages Vss+Vtp and Vcc−Vtn of the TTL level outputted from the inverter 10 and the buffer 20 and converts the TTL level into the CMOS level signal in cooperation with the inverters I6 and I7.

Therefore, the buffer 40 inverts the recovered CMOS level signal to a normal clock signal CLKout, and the buffer 50 inverts the recovered CMOS level signal to the inverted clock signal CLKoutb, and the normal clock signal CLKout and the inverted CLKoutB are concurrently outputted without a time difference.

Meanwhile, when a low level clock signal CLKin is inputted to the inverting unit 10 and the buffer 20, the PMOS transistor 12 of the inverting unit 10 and the PMOS transistor 24 of the buffer 20 are turned on.

At this time, the pull-up NMOS transistor 11, the pull-down PMOS transistor 44, the pull-up PMOS transistor 22, and the pull-down NMOS transistor 23 are always turned on in accordance with the voltage Vcc and the ground voltage Vss applied to the gates thereof.

Therefore, the voltage Vcc−Vtn at the drain of the pull-up NMOS transistor 11 is outputted to the output terminal through the PMOS transistor 12, and the voltage Vss+Vtp at the drain of the PMOS transistor 24 is outputted to the output terminal through the pull-down NMOS transistor 23.

Here, the level converting unit 30 receives the voltage Vcc−Vtn of a TTL level outputted from the inverter 10 and the buffer 20 and recovers the TTL level voltage into a CMOS level signal by using the inverters I6 and I7.

Therefore, the buffer 40 converts the recovered CMOS level signal and outputs 10 an inverted clock signal CLKoutB, and the buffer 50 inverts the recovered CMOS level signal and outputs a normal clock signal CLKout, so that the inverted clock signal CLKoutB and the normal clock signal CLKout are outputted without a time difference therebetween.

As described above, the complementary-type clock generator is directed to providing the inverter and the buffer having a symmetrical construction therebetween, recovering a TTL level voltage outputted from the inverter and the buffer into a CMOS level signal by using a level converting unit, and inverting the recovered signal. Thus the time difference between a normal clock signal and an inverted clock signal is minimized, so that more stable normal clock signal and inverted clock signal can be possible, although a driving capacitance of the transistors or resistance factors are varied due to a symmetrical circuit construction.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A clock generator for generating complementary clock signals in response to an input clock signal, comprising:

a first buffer receiving the input clock signal, said first buffer including a first plurality of transistors coupled in series with a first node at a first serial connection between two of said first plurality of transistors for outputting a first output clock signal, which changes between a first signal level and a second signal level based on the input clock signal;

an inverting unit receiving the input clock signal, said inverting unit including a second plurality of transistors coupled in series with a second node at a second serial connection between two of said second plurality of transistors for outputting a second output clock signal, which changes between the first signal level and the second signal level based on input the clock signal, the first and second output clock signals being complementary to each other; and a latch coupled between said first and second nodes, said latch having first and second inverters, an input of said first inverter and an output of said second inverter being coupled to the first node, and an output of said first inverter and an input of said second inverter being coupled to the second node, wherein said first plurality of transistors comprises first, second, third and fourth transistors, which are respectively coupled in series, each transistor having a control electrode and first and second electrodes, the control electrodes of said first and fourth transistors being commonly coupled for receiving the input clock signal, and the first serial connection of the first node being formed between the first electrodes of said second and third transistors, said control electrodes of said second and third transistors being coupled for receiving first and second signals, respectively, and said first and third transistors are NMOS transistors, and said second and fourth transistors are PMOS transistors.

2. The clock generator of claim 1 further comprising:

a second inverter buffer coupled to the first node, said second inverter buffer inverting the first output clock signal; and a third inverter coupled to said second node, said third inverter inverting the second output clock signal.

3. The clock generator of claim 1, wherein said first and second signals are ground and source voltages, respectively.

4. The clock generator of claim 1, wherein said second plurality of transistors comprises fifth, sixth, seventh, and eighth transistors, which are respectively coupled in series, each transistor having a control electrode and first and second electrodes, said control electrodes of the sixth and seventh transistors being commonly coupled for receiving the input clock signal, and the second serial connection of the second node being formed between the first electrodes of said sixth and seventh transistors, which have control electrodes commonly coupled for receiving the input clock signal, and said fifth and eighth transistors have control electrodes coupled for receiving said second and first signals, respectively.

5. The clock generator of claim 1, wherein the first signal level is Vcc–Vtn and the second signal level is Vss+Vtp, where Vcc and Vss are said source and ground voltages, respectively, and Vtn and Vtp are threshold voltages of said NMOS and PMOS transistors, respectively.

6. The clock generator of claim 1, wherein the first signal level is Vss+Vtp and the second signal level is Vcc–Vtn when the input signal is negative, where Vcc and Vss are source and ground voltages, respectively, and Vtn and Vtp are threshold voltages of said NMOS and PMOS transistors, respectively.

7. A clock generator for generating complementary clock signals in response to an input clock signal, comprising:

a first buffer coupled for receiving the input clock signal such that said first buffer outputs at a first node a first output clock signal, which changes between a first signal level and a second signal level based on the input clock signal;

an inverting unit coupled for receiving the input clock signal such that said inverting unit outputs at a second node a second output clock signal, which changes between the first signal level and the second signal level based on the input clock signal, the first and second clock output signals being complementary to each other; and a latch coupled between the first and second nodes, wherein said first buffer includes first second, third, and fourth transistors, which are respectively coupled in series, each transistor having a control electrode and first and second electrodes, the control electrodes of the first and fourth transistors being commonly coupled for receiving the input clock signal, and a first serial connection formed between the first electrodes of said second and third transistors forming the first node, and the control electrodes of said second and third transistors coupled for receiving first and second signals, and the first and second signals are ground and source voltages, respectively the first and third transistors are NMOS transistors, and said second and fourth transistors are PMOS transistors.

8. The clock generator of claim 7, wherein said latch has first and second inverters, an input of said first inverter and an output of said second inverter being coupled to the first node, and an output of said first inverter and an input of said second inverter being coupled to the second node.

9. The clock generator of claim 7 further comprising:

a second inverter coupled to the first node, said second inverter inverting the first output clock signal; and a third inverter coupled to said second node, said third inverter inverting the second output clock signal.

10. The clock generator of claim 7, wherein said inverting unit includes fifth, sixth, seventh and eighth transistors, which are respectively coupled in series, each transistor having a control electrode and first and second electrodes, said control electrodes of the sixth and seventh transistors being commonly coupled for receiving the input clock signal, and a second serial connection formed between the first electrodes of said sixth and seventh transistors forming the second node, the control electrodes of said sixth and seventh transistors being commonly coupled to receive the input clock signal, and the control electrodes of said fifth and eighth transistors being coupled for receiving the second and first signals, respectively.

11. The clock generator of claim 10, wherein the said fifth and seventh transistors are NMOS transistors, and said sixth and eighth transistors are PMOS transistors.

12. The clock generator of claim 7 wherein the first signal level is Vcc–Vtn and the second signal level is Vss+Vtp, where Vcc and Vss are said source and ground voltages, respectively and Vtn and Vtp are threshold voltages of said NMOS and PMOS transistors, respectively.

13. The clock generator of claim 7, wherein the first signal level is Vss+Vtp and the second signal level is Vcc–Vtn when the input signal is negative, where Vcc and Vss are said source and ground voltages, respectively and Vtn and Vtp are threshold voltages of said NMOS and PMOS transistors, respectively.

14. A clock generator for generating complementary clock signals in response to an input clock signal, comprising:

a first buffer receiving the input clock signal, said first buffer having first, second, third and fourth transistors, which are respectively coupled in series, each transistor having a control electrode and first and second electrodes, the control electrodes of the first and fourth transistors being commonly coupled for receiving the input clock signal, and a first serial connection formed between the first electrodes of said second and third transistors forming a first node for providing a first output clock signal, which changes between a first signal level and a second signal level based on the input clock signal, and the control electrodes of said second and third transistors receiving first and second signals at their respective control electrodes;

an inverting unit coupled for receiving the input clock signal such that said inverting unit outputs at a second node a second output clock signal, which changes between the first signal level and the second signal level based on the input clock signal, the first and second clock output signals being complementary to each other;

a second inverter coupled to the first node, said second inverter inverting the first output clock signal; and a third inverter buffer coupled to said second node, said third inverter inverting the second output clock signal, wherein the first signal is a ground voltage and the second signal is a source voltage, said first and third transistors are NMOS transistors, and said second and fourth transistors are PMOS transistors.

15. The clock generator of claim 14 further comprising a latch coupled between the first and second nodes, said latch having first and second inverters, an input of said first inverter and an output of said second inverter being coupled to the first node, and an output of said first inverter and an input of said second inverter being coupled to the second node.

16. The clock generator of claim 15, wherein said inverting unit includes fifth, sixth, seventh and eighth transistors, which are respectively coupled in series, each transistor having a control electrode and first and second electrodes, said control electrodes of the sixth and seventh transistors being commonly coupled for receiving the input clock signal, and a second serial connection formed between the first electrodes of said sixth and seventh transistors forming the second node, the control electrodes of said sixth and seventh transistors being commonly coupled to receive the input clock signal, and the control electrodes of said fifth and eighth transistors being coupled for receiving third and fourth signals, respectively.

17. The clock generator of claim 16, wherein the first and fourth signals are ground voltages, and the second and third signals are source voltages, respectively, said first, third, fifth and seventh transistors are NMOS transistors, and said second, fourth, sixth and eighth transistors are PMOS transistors.

18. The clock generator of claim 17, wherein the first signal level is Vcc−Vtn and the second signal level is Vss+Vtp, where Vcc and Vss are said source and ground voltages, respectively, and Vtn and Vtp are threshold voltages of said NMOS and PMOS transistors, respectively.

\* \* \* \* \*